(12) United States Patent
Kuo et al.

(10) Patent No.: US 9,298,557 B2
(45) Date of Patent: Mar. 29, 2016

(54) METHOD OF BOOTING SYSTEM HAVING NON-VOLATILE MEMORY DEVICE WITH ERASE CHECKING AND CALIBRATION MECHANISM AND RELATED MEMORY DEVICE

(71) Applicant: Elite Semiconductor Memory Technology Inc., Hsinchu (TW)

(72) Inventors: Chung-Shan Kuo, New Taipei (TW); Chih-Hao Chen, New Taipei (TW)

(73) Assignee: Elite Semiconductor Memory Technology Inc., Hsinchu Science Park, Hsinchu (TW)

(*) Notice: Subject to any disclaimer, the term of this patent is extended or adjusted under 35 U.S.C. 154(b) by 291 days.

(21) Appl. No.: 14/010,475

(22) Filed: Aug. 26, 2013

(65) Prior Publication Data

US 2015/0058613 A1 Feb. 26, 2015

(51) Int. Cl.
*G11C 7/22* (2006.01)
*G06F 11/14* (2006.01)
*G11C 7/10* (2006.01)
*G11C 11/4076* (2006.01)
*G11C 8/18* (2006.01)

(52) U.S. Cl.
CPC .......... *G06F 11/1441* (2013.01); *G11C 7/1006* (2013.01); *G11C 7/1051* (2013.01); *G11C 7/1072* (2013.01); *G11C 7/1078* (2013.01); *G11C 7/22* (2013.01); *G11C 11/4076* (2013.01); *G11C 8/18* (2013.01)

(58) Field of Classification Search
CPC ...... G11C 7/22; G11C 7/1072; G11C 7/1006; G11C 7/1051; G11C 7/1078; G11C 11/4076; G11C 8/18
USPC ............... 365/189.14, 189.05, 233.1, 233.13, 365/233.16, 233.17
See application file for complete search history.

(56) References Cited

U.S. PATENT DOCUMENTS

| 6,079,016 | A | 6/2000 | Park | |
|---|---|---|---|---|
| 6,885,958 | B2 * | 4/2005 | Yaklin | 702/107 |
| 8,117,483 | B2 * | 2/2012 | Welker et al. | 713/500 |
| 8,565,033 | B1 * | 10/2013 | Manohararajah et al. | 365/193 |
| 8,879,342 | B2 * | 11/2014 | Jeon | 365/193 |
| 2012/0229186 | A1 * | 9/2012 | Baba | 327/161 |
| 2012/0262987 | A1 | 10/2012 | Kuo et al. | |

* cited by examiner

*Primary Examiner* — Pho M Luu
(74) *Attorney, Agent, or Firm* — Winston Hsu; Scott Margo

(57) ABSTRACT

A method of booting a system with a non-volatile memory device includes at least the following steps: when the system is powered on, reading a status flag of at least a memory block of the non-volatile memory device, wherein the status flag indicates whether an erase operation applied to the memory block is successfully completed; selectively performing a leakage calibration process upon the memory block according to the status flag; and booting the system according to a boot code stored in the non-volatile memory device.

17 Claims, 6 Drawing Sheets

METHOD OF BOOTING SYSTEM HAVING NON-VOLATILE MEMORY DEVICE WITH ERASE CHECKING AND CALIBRATION MECHANISM AND RELATED MEMORY DEVICE

BACKGROUND OF THE INVENTION

1. Field of the Invention

The present disclosure relates generally to a memory device, and more specifically to a method of booting a system with a non-volatile memory device, and a related memory device.

2. Description of the Prior Art

In the course of erasing a non-volatile memory—or more specifically speaking, in the course of erasing a certain block within the non-volatile memory—unintended interrupts such as unexpected power off may occur. The complete erase operation will not be successfully executed in such a case. For instance, referring to FIG. 1, if the block has accomplished the "Erase" step shown in FIG. 1 but has not completed the "Over Erase Correction (OEC)" step before the unexpected power off happens, Bit Line (hereinafter BL) leakage may occur due to the Over Erase phenomenon. After the system is powered on again, this BL leakage may further affect dependent block(s) sharing a BL with the block which has not been successfully erased. If the dependent block(s) stores important booting codes inside, the booting code may fail to be read out by the system while the system is performing a start-up operation after being powered on again. This will eventually induce either a serious system failure or longer boot time.

With the ongoing and significant growth in the field of portable electronics, system stability is a major issue in many consumer electronics. Additionally, as high volume consumer markets continue to drive increasing levels of memory blocks being merged in a memory device, the potential for BL leakage has steadily increased the demands for better solutions to memory erase operations.

SUMMARY OF THE INVENTION

Therefore, one of the objectives of the present invention is to provide a method of booting a system with a non-volatile memory device and a related memory device to solve the aforementioned problems.

According to one aspect of the present invention, an exemplary method of booting a system with a non-volatile memory device is provided. The exemplary method comprises at least the following steps: when the system is powered on, reading a status flag of at least a memory block of the non-volatile memory device, wherein the status flag indicates whether an erase operation applied to the memory block is successfully completed; selectively performing a leakage calibration process upon the memory block according to the status flag; and booting the system according to a boot code stored in the non-volatile memory device.

According to another aspect of the present invention, an exemplary memory device is disclosed. The exemplary memory device comprises: a non-volatile memory device, comprising a plurality of memory blocks; a status register, coupled to the non-volatile memory device, arranged for storing a status flag which indicates whether an erase operation applied to at least a memory block of the non-volatile memory device is successfully completed; a control unit, arranged for reading the status flag when the system is powered on; and a leakage calibration unit, coupled to the control unit, arranged for selectively performing a leakage calibration process upon the memory block according to the status flag.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
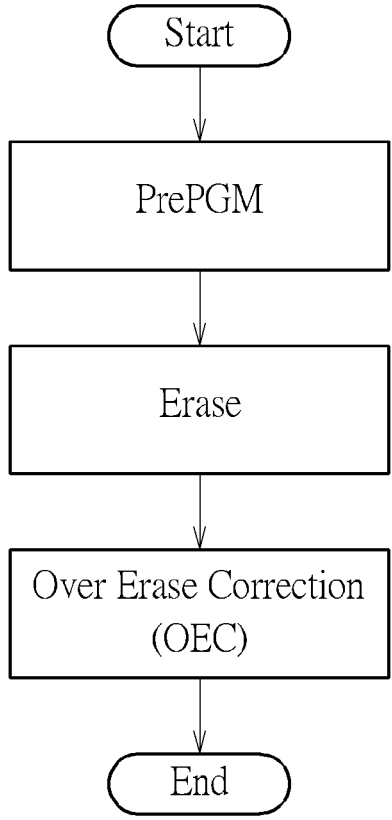
FIG. 1 is a diagram illustrating a conventional erase operation.
Figure 1:
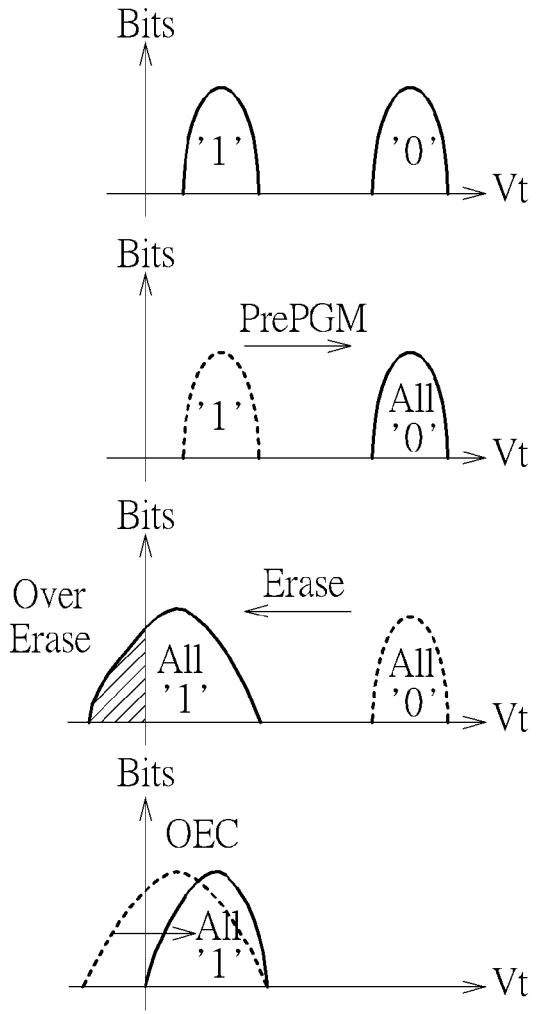
Figure 2:
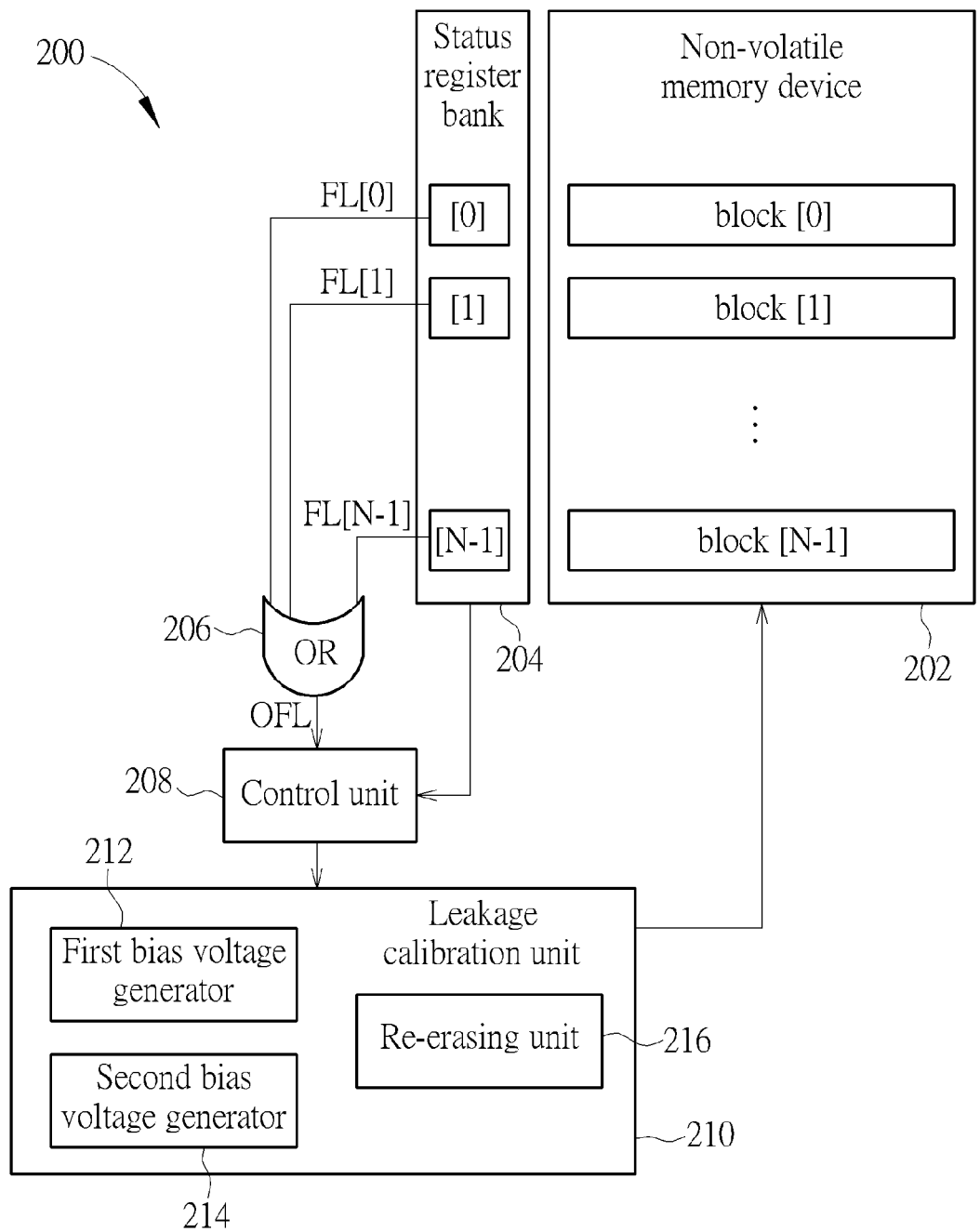
FIG. 2 is a diagram illustrating a memory device according to an embodiment of the present invention.

Please refer to FIG. 2, which is diagram illustrating a memory device 200 according to an embodiment of the present invention. The memory device 200 includes a non-volatile memory device 202, a status register bank 204, an OR gate 206, a control unit 208, and a leakage calibration unit 210. The leakage calibration unit 210 includes a first bias voltage generator 212, a second bias voltage generator 214, and a re-erasing unit 216. The non-volatile memory device 202 includes N memory blocks for storing normal data or booting codes, where N may be any positive integer. In this embodiment, memory cells of block[0] are configured to store normal data, while memory cells of block[1] are configured to store booting codes. In addition, cells of block[0] and cells of block[1] commonly share the same BIT Line (BL). In order to save die area of the overall memory device, there is no isolation device interposed between block[0] and block[1].

Figure 3:
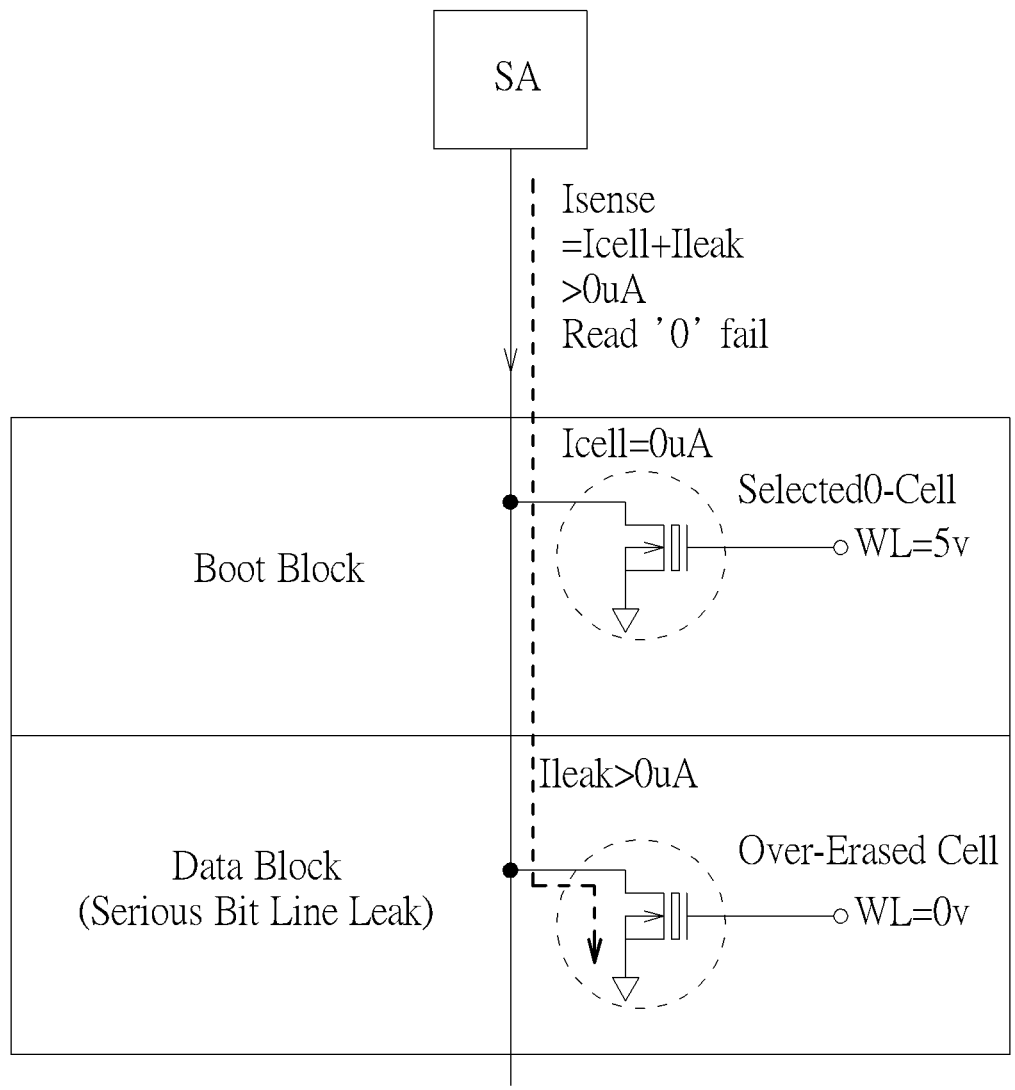
FIG. 3 is a diagram illustrating two blocks sharing one bit line.

Please refer to FIG. 3, which is a diagram illustrating two blocks sharing one BL. Provided that the Data Block (memory block for normal data) suffers from over-erasing and shares the same BL with another Boot Block (memory block for boot code), an erroneous result may occur while reading the boot code from the Boot Block. To be more specific, since the leakage current $I_{leak}$ is not equal to 0, the Sense Amplifier (SA) misjudges the sensed current $I_{sense}$ to be greater than 0 notwithstanding the desired cell current $I_{cell}$ is 0 when reading data "0" stored in the selected cell of the Boot Block. Such BL leakage issue may induce either serious system failure or longer boot time.

Please refer to FIG. 2, the status register bank 204 includes N status registers arranged for storing status flags FL, each used for indicating whether an erase operation applied to a corresponding memory block of the non-volatile memory device 202 is successfully completed. Each of the N status registers corresponds to a block in the non-volatile memory device 202. For instance, FL[0] corresponds to block[0], FL[1] corresponds to block[1], and so on. This is for illustrative purposes only, and is not meant to be a limitation of the present invention. In other embodiments of the present invention, the status register bank 204 may include a different number of status registers, i.e. not all of the memory blocks in the non-volatile memory device 202 have their corresponding status registers. For instance, it is also feasible to build status registers for those Boot Blocks storing important system codes and for those Data Blocks sharing BL with the Boot Blocks.

Figure 4:
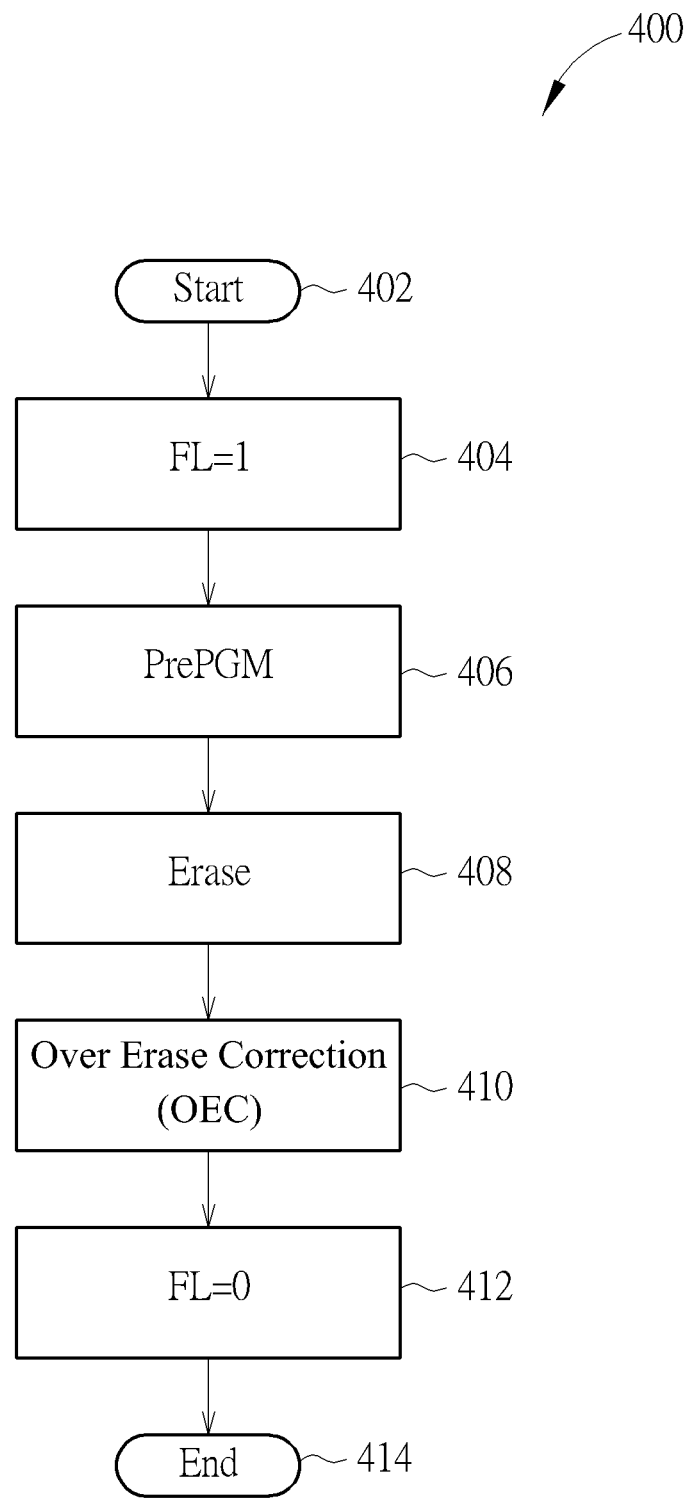
FIG. 4 is a flowchart illustrating an erase operation according to an embodiment of the present invention.

With respect to the function of the status registers, please refer to FIG. 4, which is a flowchart illustrating an erase operation 400 according to an embodiment of the present invention. In step 402, the flow starts, and certain block(s) are ready to be erased. Then, in step 404, the status register(s) corresponding to the block(s) to be erased in the status register bank 204 are set to '1', i.e. one or more of the flags FL[0]-FL[N−1] are set to '1'. Step 406-Step 410 are substantially the same as the prior art, i.e. the pre-program (PrePGM) operation, the Erase operation, and the Over Erase Correction (OEC). The related detailed descriptions are omitted here for conciseness. After Step 406-Step 410 are carried out completely, in Step 412, the status register(s) corresponding to the block(s) to be erased in the status register bank 204 are set to '0', i.e. one or more of the flags FL[0]-FL[N−1] are set to '0'. The flow ends in Step 414.

Figure 5:
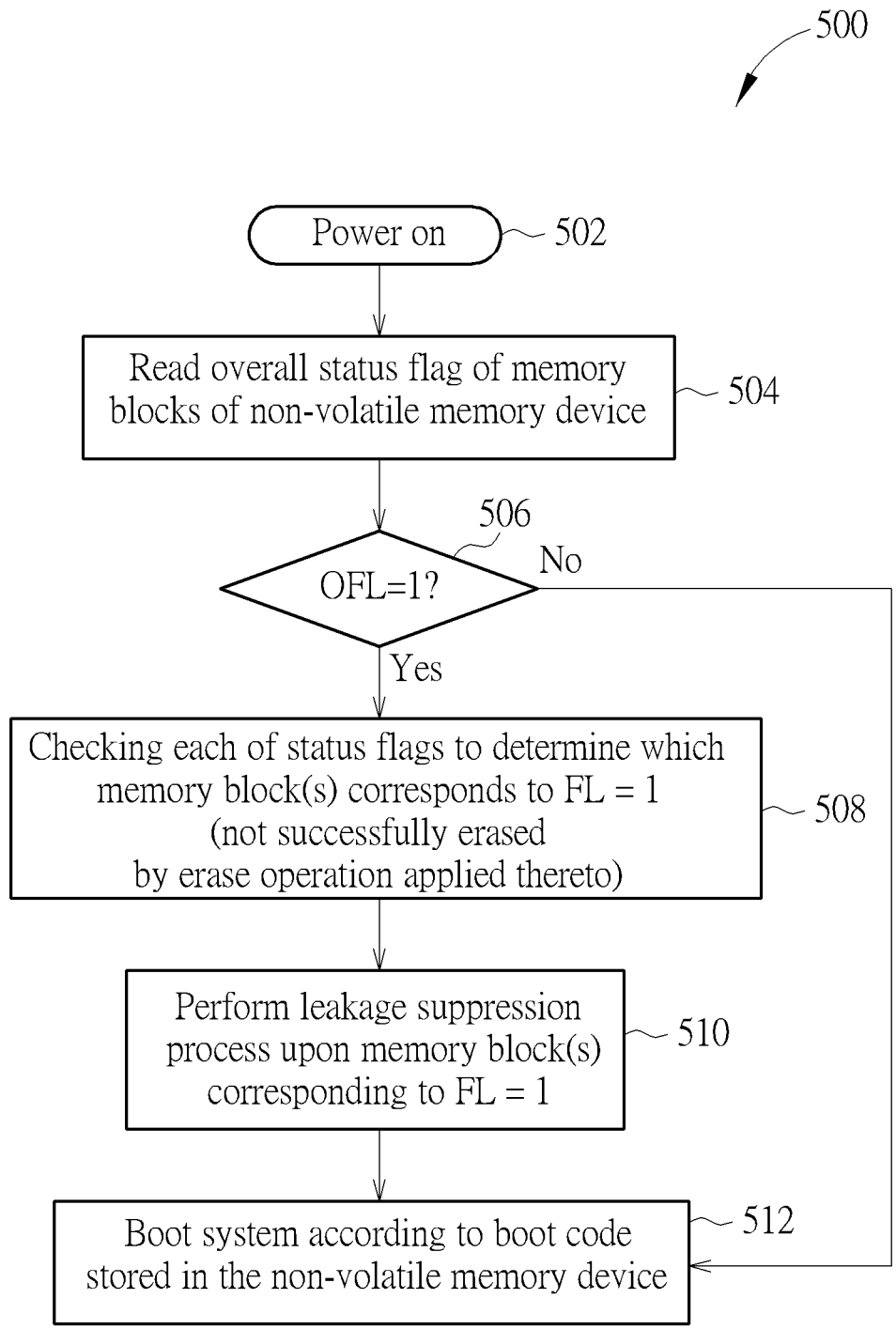
FIG. 5 is a flowchart illustrating a method of booting a system with a non-volatile memory device according to an embodiment of the present invention.

Please refer to FIG. 5, which is a flowchart illustrating a method 500 of booting a system with a non-volatile memory device according to an embodiment of the present invention. Provided that substantially the same result is achieved, the steps of the flowchart shown in FIG. 5 need not be in the exact order shown and need not be contiguous; that is, other steps can be intermediate. Some steps in FIG. 5 may be omitted according to various types of embodiments or requirements. The method may be briefly summarized as follows:

Step 502: Power on;
Step 504: Read an overall status flag OFL of all of the memory blocks of the non-volatile memory device 202;
Step 506: Check if the overall status flag OFL=1. If yes, go to step 508, else go to step 512;
Step 508: Check each of the status flags FL[0]-FL[N−1] to determine which memory block(s) corresponds to FL=1;
Step 510: Perform leakage suppression process upon the memory block(s) corresponding to FL=1; and
Step 512: Boot the system according to the boot code stored in the non-volatile memory device 202.

The overall status flag OFL is generated by the OR gate 206 shown in FIG. 2, and indicates if there is any incomplete erase operation. In step 504, the overall status flag OFL is read for indication. If the overall status flag OFL=1, the control unit 208 may perform a further checking upon each of the status flags FL[0]-FL[N−1] in step 508; otherwise, the flow goes to Step 512 directly. If the overall status flag OFL=1, meaning that there is at least one incomplete erase operation, the memory block(s) corresponding to FL=1 are found by the control unit 208, and then the leakage calibration unit 210 may apply a leakage suppression process to the unselected memory cells of found memory block(s) for ensuring the misjudging issue shown in FIG. 3 will not happen while the system is trying to read the blocks concerned.

To be more specific, when the overall status flag OFL indicates that the erase operation applied to the memory blocks is successfully completed, the first bias voltage generator 212 may apply a first bias voltage, i.e. a normal bias voltage to the unselected memory cells of the memory block. When the overall status flag OFL indicates that the erase operation applied to the memory blocks is not successfully completed, the second bias voltage generator 214 may apply a second bias voltage, i.e. a suppression bias voltage to the unselected memory cells of the memory block. In this embodiment, the second bias voltage is a negative voltage and is sufficient to turn off an over-erased memory cell. In Step 512, the system is booted according to the boot code stored in the non-volatile memory device 202. After the system is successfully booted, it may determine to either fix the memory block(s) corresponding to FL=1 or leave the memory block(s) in its status with the leakage suppression process continuing to be applied thereto.

Figure 6:
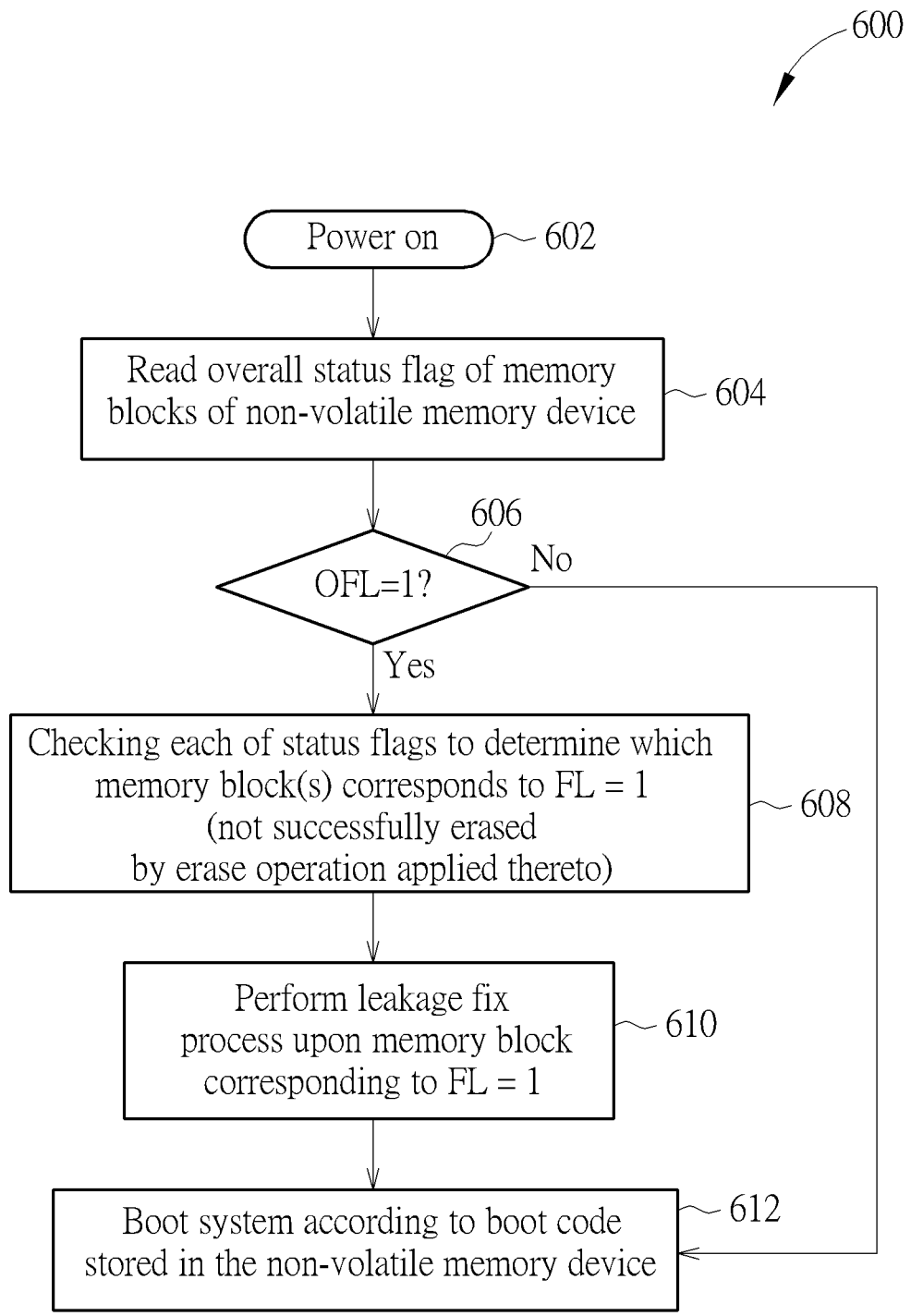
FIG. 6 is a flowchart illustrating a method of booting a system with a non-volatile memory device according to another embodiment of the present invention.

Please refer to FIG. 6, which is a flowchart illustrating a method 500 of booting a system with a non-volatile memory device according to another embodiment of the present invention. Provided that substantially the same result is achieved, the steps of the flowchart shown in FIG. 6 need not be in the exact order shown and need not be contiguous; that is, other steps can be intermediate. Some steps in FIG. 6 may be omitted according to various types of embodiments or requirements. The method may be briefly summarized as follows:

Step 602: Power on;
Step 604: Read an overall status flag OFL of all of the memory blocks of the non-volatile memory device 202;
Step 606: Check if the overall status flag OFL=1. If yes, go to step 608, else go to step 612;
Step 608: Check each of the status flags FL[0]-FL[N−1] to determine which memory block(s) corresponds to FL=1;
Step 610: Perform leakage fix process upon the memory block(s) corresponding to FL=1; and
Step 612: Boot the system according to the boot code stored in the non-volatile memory device 202.

The overall status flag OFL is generated by the OR gate 206 shown in FIG. 2, and indicates if there is any incomplete erase operation. In step 604, the overall status flag OFL is read for indication. If the overall status flag OFL=1, the control unit 208 may perform a further checking operation upon each of the status flags FL[0]-FL[N−1] in step 608; otherwise, the flow goes to Step 612 directly. If the overall status flag OFL=1, meaning that these is at least one incomplete erase operation, the memory block(s) corresponding to FL=1 are found by the control unit 208, and then the leakage calibration unit 210 may apply a leakage fix process to all the memory cells of found memory block(s) for ensuring the misjudging issue shown in FIG. 3 will not happen while the system is trying to read the blocks concerned. To be more specific, when the overall status flag OFL indicates that the erase operation applied to the memory blocks is not successfully completed, the re-erasing unit 216 may re-erase all the memory cells of the memory block.

Therefore, the prior art issues of boot failure or a longer boot time can be avoided according to the embodiments of the present invention. The system stability is therefore improved, and the BL sharing architecture is no longer a potential problem.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of booting a system with a non-volatile memory device, comprising:
    when the system is powered on, reading a status flag of at least a memory block of the non-volatile memory device, wherein the status flag indicates whether an erase operation applied to the memory block is successfully completed;
    determining whether to perform a leakage calibration process upon the memory block according to a status of the status flag; and
    booting the system according to a boot code stored in the non-volatile memory device.

2. The method of claim 1, wherein the leakage calibration process is a leakage suppression process applied to the unselected memory cells of the memory block.

3. The method of claim 2, wherein the step of selectively performing the leakage calibration process comprises:
    when the status flag indicates that the erase operation applied to the memory block is successfully completed, applying a first bias voltage to the unselected memory cells of the memory block; and
    when the status flag indicates that the erase operation applied to the memory block is not successfully completed, applying a second bias voltage to the unselected memory cells of the memory block;
    wherein the second bias voltage is lower than the first bias voltage.

4. The method of claim 3, wherein the second bias voltage is sufficient to turn off an over-erased memory cell.

5. The method of claim 3, wherein the second bias voltage is a negative voltage.

6. The method of claim 2, further comprising:
    after the system is booted, performing a leakage fix process upon the memory block.

7. The method of claim 1, wherein the leakage calibration process is a leakage fix process applied to the memory block.

8. The method of claim 7, wherein the step of selectively performing the leakage calibration process comprises:
    when the status flag indicates that the erase operation applied to the memory block is not successfully completed, re-erasing the memory block.

9. The method of claim 1, wherein the non-volatile memory device comprises a plurality of memory blocks, and the step of reading the status flag of at least the memory block of the non-volatile memory device comprises:
    reading a status flag of each of the memory blocks of the non-volatile memory device; and
    obtaining an overall status flag by performing an OR operation upon a plurality of status flags of the memory blocks; and
    the method further comprises:
    checking the overall status flag to determine if the non-volatile memory device has at least one memory block which is not successfully erased by the erase operation applied thereto.

10. A memory device, comprising:
    a non-volatile memory device, comprising a plurality of memory blocks;
    a status register, coupled to the non-volatile memory device, arranged for storing a status flag for indicating whether an erase operation applied to at least a memory block of the non-volatile memory device is successfully completed;
    a control unit, arranged for reading the status flag when the system is powered on; and
    a leakage calibration unit, coupled to the control unit, arranged for determining whether to perform a leakage calibration process upon the memory block according to a status of the status flag.

11. The memory device of claim 10, wherein the leakage calibration process is a leakage suppression process applied to the unselected memory cells of the memory block.

12. The memory device of claim 11, wherein the leakage calibration unit comprises:
    a first bias voltage generator, wherein when the status flag indicates that the erase operation applied to the memory block is successfully completed, the first bias voltage generator is arranged for applying a first bias voltage to the unselected memory cells of the memory block; and
    a second bias voltage generator, wherein when the status flag indicates that the erase operation applied to the memory block is not successfully completed, the second bias voltage generator is arranged for applying a second bias voltage to the unselected memory cells of the memory block;
    wherein the second bias voltage is lower than the first bias voltage.

13. The memory device of claim 12, wherein the second bias voltage is sufficient to turn off an over-erased memory cell.

14. The memory device of claim 12, wherein the second bias voltage is a negative voltage.

15. The memory device of claim 10, wherein the leakage calibration process is a leakage fix process applied to the memory block.

16. The memory device of claim 15, wherein the leakage calibration unit comprises:
    a re-erasing unit, wherein when the status flag indicates that the erase operation applied to the memory block is not successfully completed, the re-erasing unit is arranged for re-erasing the memory block.

17. The memory device of claim 10, further comprising:
    a plurality of status registers; and
    an OR gate, coupled to the status registers, arranged for generating an overall status flag;
    wherein the control unit reads the overall status flag when the system is powered on, and when the overall status flag indicates the non-volatile memory device has at least one memory block which is not successfully erased by the erase operation applied thereto, the control unit reads the status registers respectively to find the memory block which is not successfully erased by the erase operation applied thereto.

* * * * *